(12) United States Patent
Joshi et al.

(10) Patent No.: US 7,285,480 B1
(45) Date of Patent: Oct. 23, 2007

(54) INTEGRATED CIRCUIT CHIP WITH FETS HAVING MIXED BODY THICKNESSES AND METHOD OF MANUFACTURE THEREOF

(75) Inventors: Rajiv V. Joshi, Yorktown Heights, NY (US); Louis C. Hsu, Fishkill, NY (US); Oleg Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/279,063

(22) Filed: Apr. 7, 2006

(51) Int. Cl.
*H01L 21/00* (2006.01)

(52) U.S. Cl. ............................. 438/480; 257/E21.563

(58) Field of Classification Search ............... 438/480; 257/E21.563
See application file for complete search history.

(56) References Cited

U.S. PATENT DOCUMENTS

| | | | |
|---|---|---|---|
| 6,403,435 B1 * | 6/2002 | Kang et al. | 438/311 |
| 6,414,355 B1 * | 7/2002 | An et al. | 257/347 |
| 6,548,369 B1 * | 4/2003 | van Bentum | 438/404 |

\* cited by examiner

*Primary Examiner*—Lex Malsawma
(74) *Attorney, Agent, or Firm*—Law Office of Charles W. Peterson, Jr.; Satheesh K. Karra, Esq.; Rafael Perez-Pineiro, Esq.

(57) ABSTRACT

An Integrated Circuit (IC) chip that may be a bulk CMOS IC chip with silicon on insulator (SOI) Field Effect Transistors (FETs) and method of making the chip. The IC chip includes areas with pockets of buried insulator strata and FETs formed on the strata are SOI FETs. The SOI FETs may include Partially Depleted SOI (PD-SOI) FETs and Fully Depleted SOI (FD-SOI) FETs and the chip may include bulk FETs as well. The FETs are formed by contouring the surface of a wafer, conformally implanting oxygen to a uniform depth, and planarizing to remove the Buried OXide (BOX) in bulk FET regions.

12 Claims, 5 Drawing Sheets

INTEGRATED CIRCUIT CHIP WITH FETS HAVING MIXED BODY THICKNESSES AND METHOD OF MANUFACTURE THEREOF

FIELD OF THE INVENTION

The present invention is related to field effect transistor (FET) Integrated Circuit (IC) chip manufacture and more particularly to manufacturing CMOS IC chips including bulk FETs, Partially Depleted Silicon On Insulator (PD SOI) FETs and Fully Depleted Silicon On Insulator (FD SOI) FETs.

BACKGROUND DESCRIPTION

Semiconductor technology and chip manufacturing advances have resulted in a steady decrease of chip feature size to increase on-chip circuit switching frequency (circuit performance) and the number of transistors (circuit density). Shrinking/reducing device or field effect transistor (FET) feature sizes and, correspondingly, device minimum dimensions including horizontal dimensions (e.g., minimum channel length) and vertical dimensions (e.g., channel layer depth, gate dielectric thickness, junction depths and etc.) shrinks device size for increased device density and device performance, as well as reduces device operating conditions, i.e., chip and correspondingly, device supply voltages and voltage swings. Generally, all other factors being constant, the active power consumed by a given unit increases linearly with switching frequency, i.e., performance. Thus, not withstanding the decrease of chip supply voltage, chip power consumption has increased as well. Both at the chip and system levels, cooling and packaging costs have escalated as a natural result of this increase in chip power. For low end systems (e.g., handhelds, portable and mobile systems), where battery life is crucial, reducing net power consumption is important but, such a power reduction must come without degrading chip/circuit performance below acceptable levels.

To minimize semiconductor circuit power consumption, most Integrated Circuits (ICs) are made in the well-known complementary insulated gate FET technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (modeled simply as a closed switch), the other device (the PFET) is off, not conducting (ideally modeled as an open switch) and, vice versa. Thus, ideally, there is no static or DC current path in a typical CMOS circuit and ideal CMOS circuits use no static or DC power and only consume transient power from charging and discharging capacitive loads.

In practice, however, typical FETs are much more complex than switches and transient power for circuit loads accounts for only a portion of CMOS chip power consumption. FET drain to source current (DC current and so, DC power consumed) is dependent upon circuit conditions and device voltages. Especially since device $V_T$ is directly proportional to gate dielectric thickness, as FET features (including gate dielectric and channel thickness) shrink, off FETs conduct what is known as subthreshold current, i.e., at gate biases below threshold for NFETs and above for PFETs. Further, for a particular device, subthreshold current increases exponentially with the magnitude of the device's drain to source voltage ($V_{ds}$) and reduces exponentially with the magnitude of the device's $V_T$. This is especially true in what is known as partially depleted (PD) or fully depleted (FD) silicon on insulator (SOI) technologies, where devices are formed in a thin uniform silicon surface layer. PD-SOI and FD-SOI FETs have suffered from dramatically increased subthreshold leakage to the point that, in some PD-SOI and FD-SOI IC chips it is the leakage dominant source.

Especially for complex chips and arrays with a large number of devices, device leakage (both gate and subthreshold) chip leakage power can be overwhelming, for PD-SOI and FD-SOI IC chips. When multiplied by the millions and even billions of devices on a state of the art IC, even 100 picoAmps (100 pA) of leakage in each of a million circuits, for example, results in chip leakage on the order of 100 milliAmps (100 mA). Thus, as chip features have shrunk, these leakage sources have become more prominent, especially for PD-SOI and FD-SOI IC chips. Approaches to increasing device $V_T$ to mitigate subthreshold leakage, e.g., with thicker gate dielectric or back biasing device channels for example, have been applied uniformly across all circuits on a PD-SOI and FD-SOI IC chip. Moreover, chip performance could be optimized while minimizing chip power, by allowing mixed circuits of different device types, i.e., PD-SOI, FD-SOI and bulk, rather than being constrained to using a single technology device for all circuits.

However, state of the art approaches to integrating these three disparate type of device technology devices on the same chip have not yielded satisfactory results. For example, a typical such state of the art approach would require at least two definition implants at two different energies and two different dose levels, one to define PD-SOI areas and a second to define FD-SOI areas in a chip location on a bulk wafer. Such a process requires two independent mask steps, one for each implant. Such a two step mask and implant carries with it critical alignment requirements to align to buried features at different depths, i.e., Buried OXide (BOX) at one depth in PD-SOI areas and at a second in FD-SOI areas. Unfortunately, each mask scatters oxygen ions, i.e., some ions passing through open mask patterns, randomly reflect of the vertical sides of the mask, scattering those ions as hey are implanted into the wafer. This scattering results in rough buried oxide with pronounced edges at the mask edges. When forming a thin uniform surface layer is critical for good device characteristics, such as for forming both PD-SOI and FD-SOI devices, irregularities in the underlying BOX can be disastrous. Further, any misalignment of the two masks is critical and could result in larger edge and boundary irregularities. There irregularities impact device density because devices cannot be placed in the vicinity. So, for example, as much as ten times (10×) the printable feature size may be lost along these boundaries. Consequently, the added complexity of multiple masked implants at different energies and dose levels in combination with implant scattering effects (i.e., BOX that is not well defined, not uniform and has pronounced edges) impacting device density, minimizes the usefulness of such an approach.

Thus, there is a need for a simple, reliable way to include PD-SOI and FD-SOI devices on bulk FET IC chips without severely impacting device density.

SUMMARY OF THE INVENTION

It is a purpose of the invention to include PD-SOI and FD-SOI devices on same Integrated Circuit (IC) chip with bulk devices;

It is yet another purpose of the invention to include PD-SOI and FD-SOI FETs on bulk FET IC chips without significantly impacting device density;

It is yet another purpose of the invention to simply, reliably form bulk IC chips with PD-SOI and FD-SOI FETs selectively included in some chip circuits.

The present invention relates to an Integrated Circuit (IC) chip that may be a bulk CMOS IC chip with silicon on insulator (SOI) Field Effect Transistors (FETs) and method of making the chip. The IC chip includes areas with pockets of buried insulator strata and FETs formed on the strata are SOI FETs. The SOI FETs may include Partially Depleted SOI (PD-SOI) FETs and Fully Depleted SOI (FD-SOI) FETs and the chip may include bulk FETs as well. The FETs are formed by contouring the surface of a wafer, conformally implanting oxygen to a uniform depth, and planarizing to remove the Buried OXide (BOX) in bulk FET regions.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
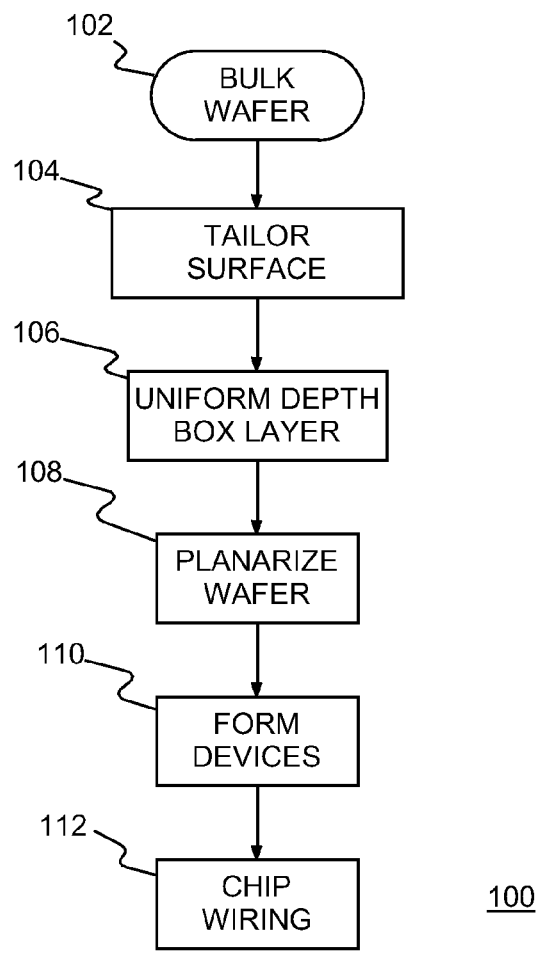
FIG. 1 shows an example of a method of forming mixed technology Field Effect Transistors (FETs) on the same chip according to a preferred embodiment of the present invention.

Turning now to the drawings and, more particularly, FIG. 1 shows an example of a method 100 of forming Field Effect Transistors (FETs) of mixed disparate technologies on the same chip according to a preferred embodiment of the present invention. In particular, the IC is made in the well-known complementary insulated gate FET technology known as CMOS and includes bulk FETs and Silicon On Insulator (SOI) FETs formed in the same surface of a semiconductor (e.g., silicon) chip or wafer. More particularly, beginning with a bulk wafer 102, both Partially Depleted SOI (PD-SOI) FETs and Fully Depleted SOI (FD-SOI) FETs may be formed in a common wafer surface with bulk transistor FETs. So, in step 104 the wafer surface is tailored or contoured. The contour defines partially depleted device and fully depleted device areas. Next in step 106 dielectric (e.g., oxide) is formed beneath the tailored surface at a uniform depth, e.g., implanting oxygen to form Buried OXide (BOX). Pockets of BOX form strata at different depths in each defined area. Next in step 108, the tailored surface is planarized to remove the surface layer above, and including BOX pockets in bulk transistor regions. Thus, the remaining bulk wafer has BOX strata at multiple depths, only 2 in this example, for forming PD-SOI FETs and FD-SOI FETs coincident with forming bulk FETs where the BOX pockets have been removed. Thereafter, in step 110 device formation continues, forming N and P wells where appropriate, forming device electrodes (gates and source/drain regions) for both n-type FETs (NFETs) and p-type FETs (PFETs). Finally, in step 112 IC chip formation continues, e.g., forming chip wiring to connect devices together into circuits, and through normal Back End Of the Line (BEOL) processing, e.g., connecting circuits to chip pads.

Accordingly, the present invention provides a cost-effective way to produce IC chips with FETs that have dramatically different body thicknesses on the same bulk substrate. All masking is done to tailor the surface prior to BOX implant. So, as is normally done to form PD-SOI chips or FD-SOI chips, preferred embodiment IC chips are formed using a single uniform oxygen implant. Since the hard mask is removed before implanting oxygen to form BOX strata, hard mask edges, that otherwise would scatter oxygen ions, are not in place, and scattering does not occur. So, advantageously, the resulting BOX strata are fully self-aligned with seamless boundaries between PD-SOI, FD-SOI and bulk regions. Advantageously, there are no draconian constraints on placing PD-SOI, FD-SOI and bulk devices. So, a preferred embodiment chip may have circuits of these different disparate technologies and take advantage of different strengths of each technology.

Figure 2:
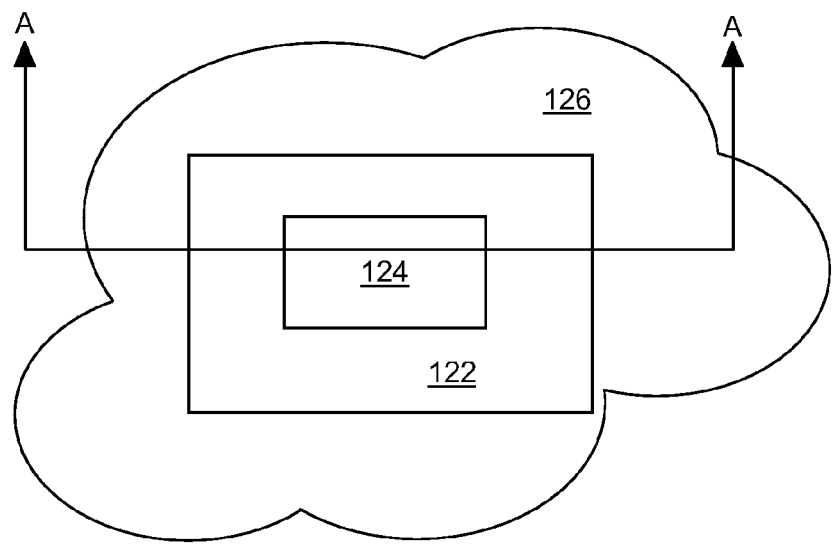
FIG. 2 shows a plan view example of tailoring the surface of a wafer for PD SOI, FD-SOI and bulk FET formation.
Figure 3A:
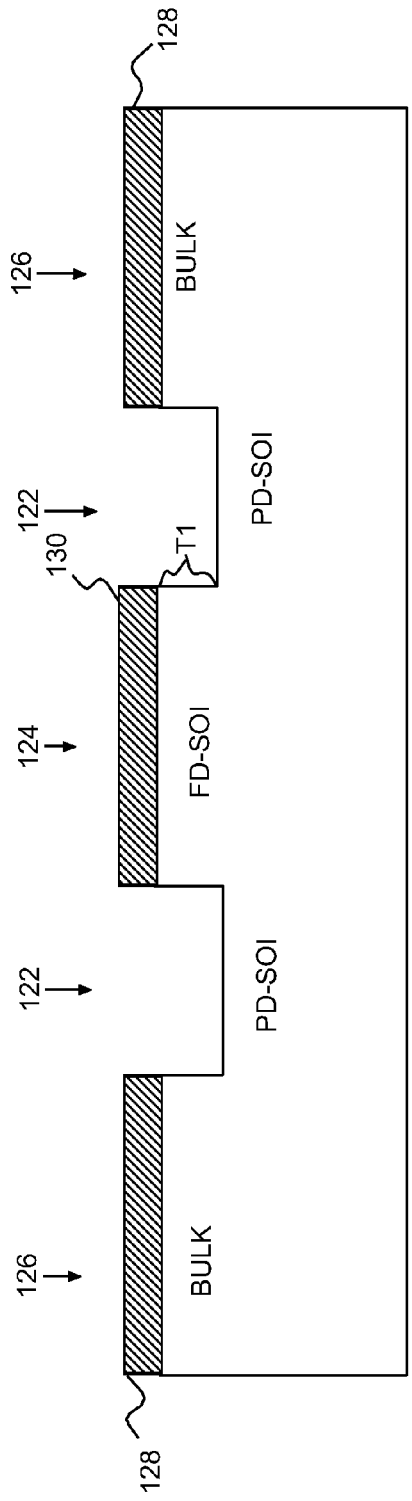
FIGS. 3A-D show a cross section of the surface through AA.
Figure 3B:
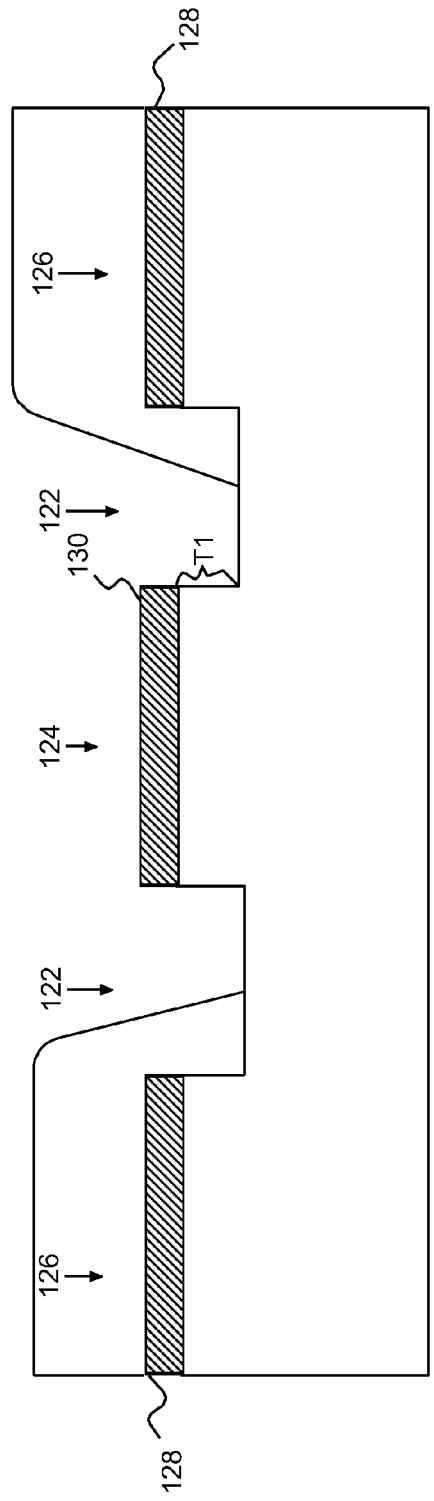

FIGS. 2 and 3A-D show an example of tailoring the surface of a wafer 120, e.g., in step 104 of FIG. 1. FIG. 2 shows a plan view and FIGS. 3A-B show cross sections through AA. In this example, a partially depleted area 122 rings a fully depleted area or island 124. The surrounding areas 126 are to remain bulk silicon. So, first a hard mask 128, 130 is formed on the wafer 120, to protect fully depleted regions, e.g., island 124, and bulk areas 126. Then, as shown in the example of FIG. 3A, a thickness (T1) of the wafer is removed in partially depleted areas 122 using a suitable etchant. So, for example, the exposed partially depleted areas 122 may be etched using a typical Reactive Ion Etch (RIE) with sufficient precision etch depth of 95-275 nanometers (95-275 nm). Having defined the partially depleted areas 122, the hard mask 128 is removed from the fully depleted areas 124.

Figure 3C:
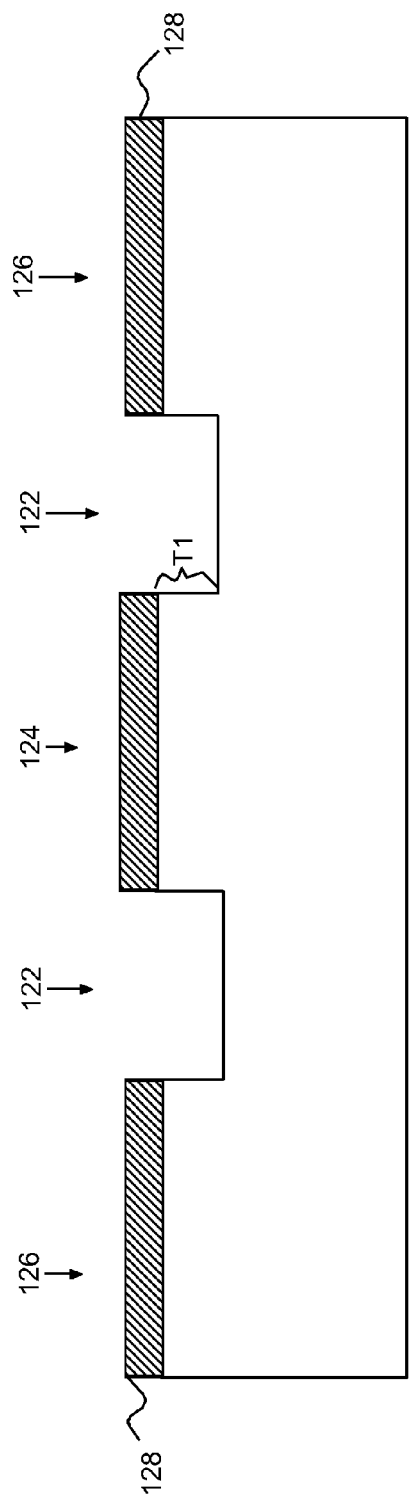
Figure 3D:
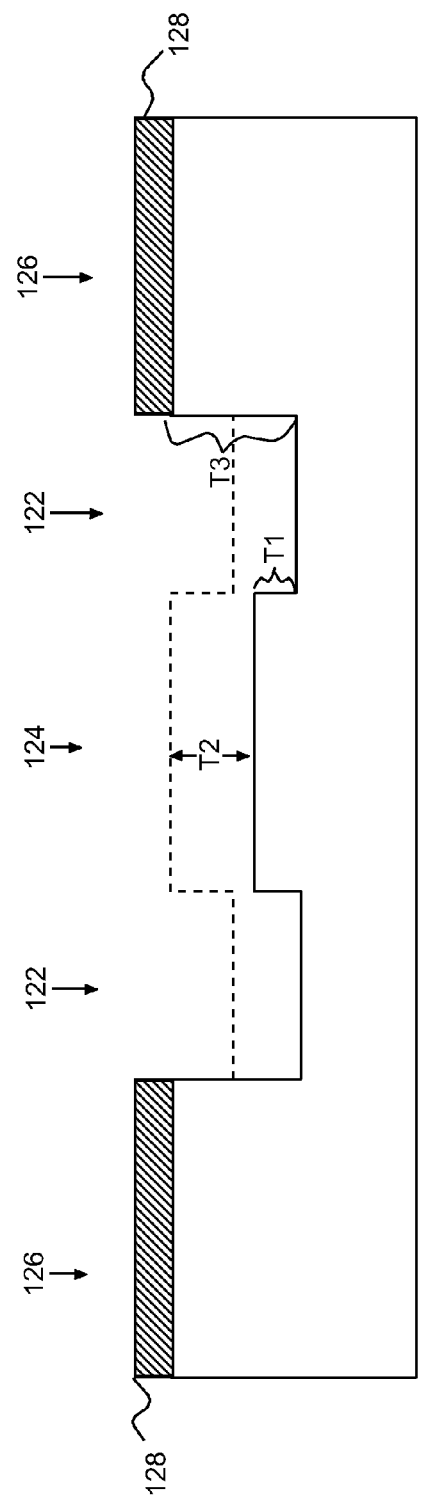

So, as shown in the example of FIG. 3B, the bulk area mask 130 may be masked temporarily with a mask 131 of a suitable material, and the exposed fully depleted hard mask 128 removed from fully depleted area 124 islands. Then, the temporary mask 131 is removed from the wafer 120. In the example of FIG. 3C, after re-exposing the fully depleted area 124 islands the a suitable etchant, e.g., RIE, is used to remove a thickness (T2) of the wafer 120, simultaneously from both the partially depleted areas 122 and from the exposed fully depleted areas 124. Essentially, T2 determines the depth of the subsequently formed (in step 106 of FIG. 1) dielectric, and may be any suitable value, e.g., 10-100 nm. So, as shown in the example of FIG. 3D, the surface contour has a topology with plateaus in bulk areas 126, valleys (at a depth T3 below the plateaus, i.e., T3=T1+T2) in partially depleted areas 122 and intermediate terraces in fully depleted areas 124. Further, this surface tailoring step guarantees that the partially depleted areas 122 and the exposed fully depleted areas 124 seamlessly butt each other after BOX is formed. Since these areas butt each other, device alignment is significantly improved to reduce wasted area for high device density. Having tailored the surface, the remaining mask 130 is removed from the bulk areas 126.

Figure 4:
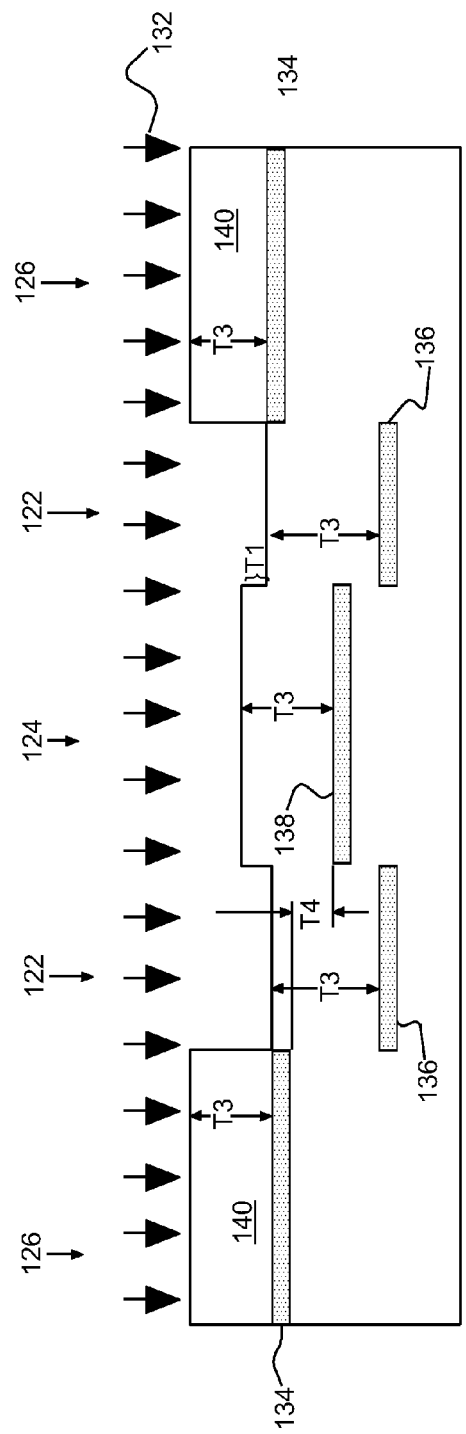
FIG. 4 shows implanting Oxygen with a single implant to a uniform depth into the tailored surface.

FIG. 4 shows implanting Oxygen (arrows 132) with a single implant energy and dose to a uniform depth into the tailored surface, e.g., in step 106 of FIG. 1. The implanted oxygen conformally penetrates the surface contour to the same relative depth, T3. So, the subsurface oxygen pockets form strata at different depths instead of in a planar layer. The wafer may be annealed such that the oxygen forms Buried OXide (BOX) strata 134, 136, 138, each T3 below the contoured surface. Further, the subsurface oxygen strata 134, 136, 138 have the same subsurface placement as the surface contour, i.e., forming upper plateau strata 134 below surface layer 140 in bulk areas 126, lower valley strata 136 in partially depleted areas 122 and intermediate terrace strata 138 in fully depleted areas 124. Preferably, the intermediate terrace strata 138 form at a depth (T4) below upper plateau strata 134, where T4=5-25 nm; and the lower valley strata 136 form below the intermediate terrace strata 138 at the initial partially depleted area 122 etch depth, T1.

Figure 5:
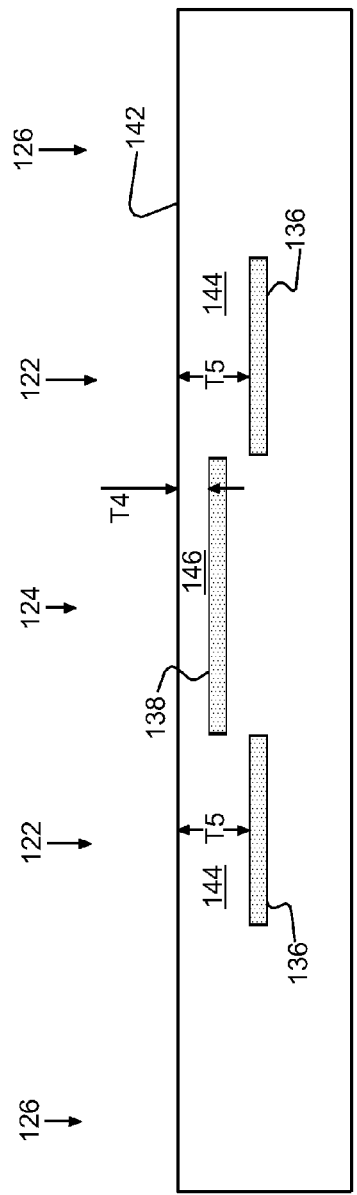
FIG. 5 shows an example planarizing the wafer.

FIG. 5 shows an example of planarizing the contoured surface of wafer 120, e.g., in step 108 of FIG. 1. Preferably, the wafer 120 is planarized to surface 142 using a suitable chemical-mechanical-polish (chem-mech-polish or CMP), such as are well known in the art, to remove the bulk area surface layer (140 in FIG. 4) and BOX strata 134. The resulting SOI layer in partially depleted areas 122 has a thickness (T5), that is, essentially, the sum of thickness (T4) of the resulting SOI layer in fully depleted areas 122 and the initial partially depleted area 122 etch depth, T1. So, preferably, the partially depleted surface layer 144 in areas 122 is 100-300 nm thick (T5) and the fully depleted surface layer 146 in areas 124 is 5-25 nm thick (T4).

CMP may cause dishing when the partially depleted areas 122/fully depleted areas 124 occupy a large portion of the chip area. So, preferably, the total chip area occupied by the partially depleted areas 122 and fully depleted areas 124 is less than 20% of the total chip area. Further, it is preferable that the fully depleted areas 124 occupy less than 50% of the total chip area encompassed by the partially depleted areas 122. Also, it is preferable that the fully depleted areas 124 are located in partially depleted areas 122 and such regions are uniformly distributed across the chip 120 for optimum silicon thickness control, especially in the fully depleted areas 124. It should be noted, however, that this arrangement of fully depleted islands 124 in partially depleted areas 122 that are surrounded by bulk areas 126 is for example only and not intended as a limitation. For example, multiple fully depleted islands 124 may be located in a single partially depleted area 122, multiple fully depleted islands 124 and/or partially depleted areas 122 may be located in disparate bulk areas 126, or a bulk chip 120 may include only fully depleted islands 124 or partially depleted areas 122.

Figure 6:
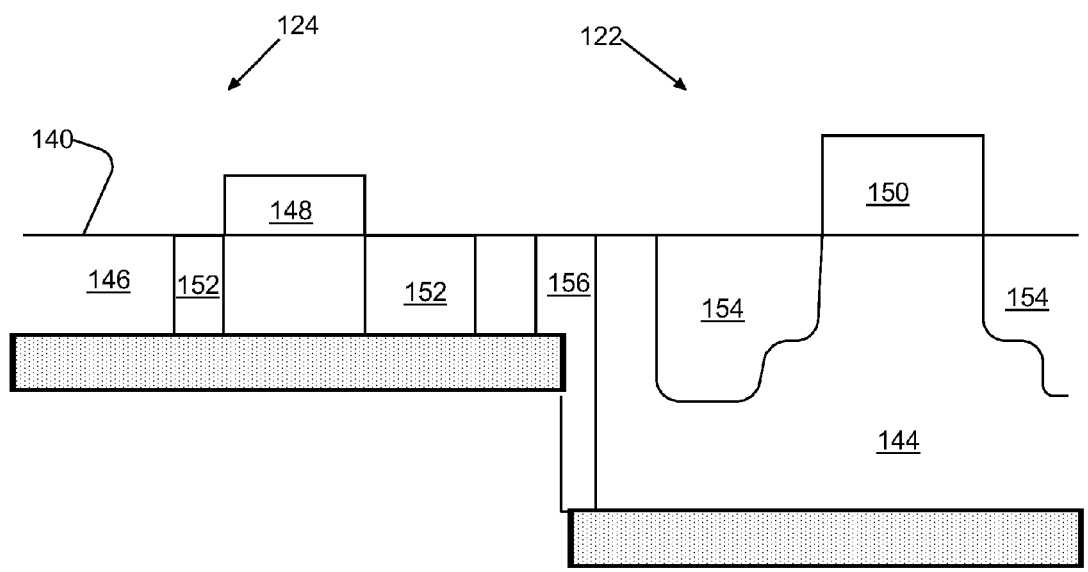
FIG. 6 shows an example of gates for PD-SOI, FD-SOI, coincidentally formed on a planarized bulk wafer.

FIG. 6 shows an example of PD-SOI and FD-SOI gates 148, 150 formed coincidentally on the planarized surface 140 with bulk FETs (not shown). Source/drain regions 152, 154 are formed at either end of the gates 148, 150. Typically, the gates 148, 150 and source/drain regions 152, 154 are salicided to reduce terminal resistance. Wiring (not shown) connects to low resistance contacts at gates 148, 150 and source/drain regions 152, 154. Subsequently formed wiring connects devices together into circuits, and through normal Back End Of the Line (BEOL) processing wiring structures to chip pads. Guardrings 156 isolate FD-SOI regions 124 from PD-SOI regions 122 and PD-SOI regions 122 from bulk regions (not shown). Guardrings 156 may also provide local body biases for respective FD-SOI regions 124 and PD-SOI regions 122. Although shown in this example separated by guardrings 156, this is for example only. Any suitable isolation technique may be used to separate 156 isolate FD-SOI regions 124 from PD-SOI regions 122 and PD-SOI regions 122 from bulk regions, such as for example, Shallow Trench Isolation (STI) or deep trench isolation.

Figure 7:
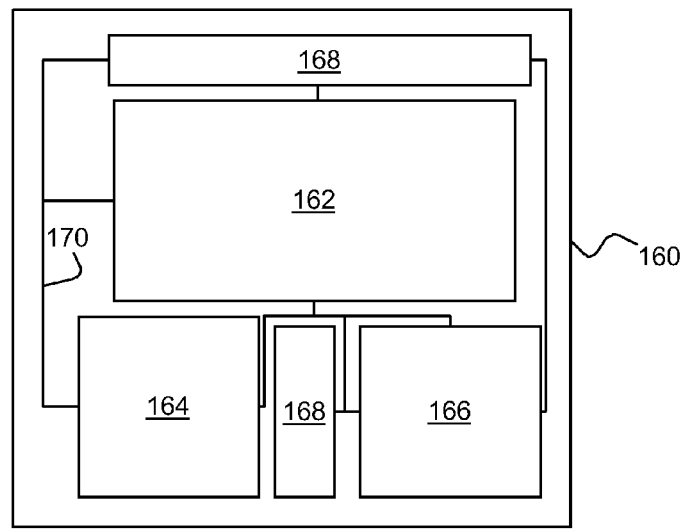
FIG. 7 shows an example of an IC chip formed according to a preferred embodiment of the preset invention.

FIG. 7 shows an example of an IC chip 160 formed according to a preferred embodiment of the preset invention. In this example the major portion of chip logic 162, 164, 166 are in bulk FET technology, e.g., bulk CMOS, and regions 168 of PD-SOI and/or FD-SOI FETs, connected by chip wiring 170. The PD-SOI and/or FD-SOI regions 168 may include, for example, high-speed clock circuits and memory. The PD-SOI and/or FD-SOI regions 168 are judiciously located at strategic chip positions for maximum performance gain, but with minimum additional power over the same chip entirely in bulk CMOS.

Advantageously, instead of being forced to choose between PD-SOI, FD-SOI and bulk for an entire chip design, designers may selectively use devices from each technology on the same chip, according to a preferred embodiment of the present invention. The designer may keep major portions of the chip design in bulk technology for better thermal and substrate contacts, and for reduced noise. Designers may avail themselves of higher performance PD-SOI and FD-SOI circuits for very small portions of the chip, for example high-speed clock circuits or memory, to selectively gain performance where it is needed, while incurring minimum additional chip leakage. Thus, a preferred embodiment chip is tailored to gain performance where it will provide meaningful results and, where performance is not critical, to forego performance for significantly reduced overall power and reliability. So, there are no spacing constraints on placing PD-SOI, FD-SOI and bulk devices and, advantageously, the resulting BOX strata are fully self-aligned with seamless boundaries between PD-SOI, FD-SOI and bulk regions. As a result, a preferred embodiment chip may have circuits of devices of these different disparate technologies to take advantage of different strengths of each.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming Integrated Circuit (IC) chips, said method comprising the steps of:
   a) defining areas of a first transistor type in a surface of a semiconductor wafer, defining first transistor type areas comprising the steps of:
      i) forming a hard pattern on said semiconductor wafer surface, first transistor type areas being exposed by said hard pattern, and
      ii) etching exposed said first transistor type areas of said wafer surface to a first depth;
   b) defining areas of a second transistor type in said surface, remaining areas of said semiconductor wafer being of a third transistor type, defining second transistor type areas comprising the steps of:
      i) removing selected portions of said hard pattern, second transistor type areas being exposed by removal of said selected portions, and
      ii) etching exposed said second transistor type areas of said wafer surface to a second depth, said exposed first transistor type areas being further etched by said second depth;

c) forming insulating material strata at said first transistor type and said second transistor type areas; and
d) selectively forming device gates, ones of said device gates being located above said insulating material strata.

2. A method as in claim 1, wherein the etching step (ii) comprises etching 95-275 nm into said surface.

3. A method as in claim 1, wherein the second etching step (b)(ii) comprises etching 10-100 nm from said exposed first transistor type areas and said exposed second transistor type areas.

4. A method as in claim 1, wherein third transistor type areas remain protected by remaining portions of said hard pattern.

5. A method as in claim 1, wherein the step (c) of forming insulating material strata comprises the steps of:
   i) removing remaining portions of said hard pattern;
   ii) conformally implanting oxygen through the contoured said surface to a uniform depth; and
   iii) planarizing said contoured surface through said insulating material strata on said third transistor type areas.

6. A method as in claim 5, wherein oxygen is uniformly implanted 10-100 nm beneath said contoured surface and said insulating material strata are pockets of Buried OXide (BOX).

7. A method as in claim 6, wherein first transistors are Partially Depleted Silicon On Insulator (PD-SOI) Field Effect Transistors (FETs), second transistors are Fully Depleted SOI (FD-SOI) FETs and third transistors are bulk FETs.

8. A method of forming CMOS Integrated Circuit (IC) chips, said method comprising the steps of:
   a) defining Partially Depleted Silicon On Insulator (PD-SOI) Field Effect Transistor (FET) areas in a surface of a silicon wafer, defining PD-SOI FET areas comprising the steps of:
      i) forming a hard mask pattern on said surface, said hard mask pattern exposing PD-SOI FET areas, and
      ii) etching exposed said PD-SOI FET areas to a first depth;
   b) defining Fully Depleted SOI (FD-SOI) FET areas in said surface, remaining areas of said semiconductor wafer being bulk FET areas, defining FD-SOI FET areas comprising the steps of:
      i) removing FD-SOI FET area portions of said hard mask pattern; and
      ii) etching exposed said FD-SOI FET areas to a second depth, said exposed said PD-SOI FET areas being further etched by said second depth;
   c) forming insulating material strata at PD-SOI FET and FD-SOI FET said areas; and
   d) forming FET conduction electrodes in each of said PD-SOI FET areas, said FD-SOI FET areas and said bulk FET areas.

9. A method as in claim 8, wherein said PD-SOI FET areas are etched 105-375 nm below the surface at said bulk FET areas and 10-100 nm at said FD-SOI FET areas.

10. A method as in claim 9, wherein the step (c) of forming insulating material strata comprises the steps of:
    i) removing said remaining portions of said hard mask pattern;
    ii) conformally implanting oxygen through the contoured said surface to a uniform depth; and
    iii) planarizing said contoured surface through said insulating material strata in said bulk FET areas.

11. A method as in claim 10, wherein oxygen is uniformly implanted 10-100 nm beneath the etched surface and said insulating material strata are pockets of Buried OXide (BOX).

12. A method as in claim 8, wherein the step (d) of FET conduction electrodes comprises the steps of:
    i) selectively forming FET gates on said silicon wafer; and
    ii) forming source/drain regions at either end of said FET gates.

* * * * *